(12) United States Patent
Kim et al.

(10) Patent No.: US 9,153,564 B2
(45) Date of Patent: Oct. 6, 2015

(54) POWER MODULE PACKAGE AND METHOD OF MANUFACTURING THE SAME

(71) Applicant: SAMSUNG ELECTRO-MECHANICS CO., LTD., Suwon-Si (KR)

(72) Inventors: Kwang Soo Kim, Suwon-Si (KR); Joon Seok Chae, Suwon-Si (KR); Young Hoon Kwak, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/452,524

(22) Filed: Aug. 5, 2014

(65) Prior Publication Data

US 2015/0214199 A1    Jul. 30, 2015

(30) Foreign Application Priority Data

Jan. 28, 2014    (KR) .................. 10-2014-0010456

(51) Int. Cl.
| | |
|---|---|
| *H01L 23/34* | (2006.01) |
| *H01L 25/16* | (2006.01) |
| *H01L 23/495* | (2006.01) |
| *H01L 25/00* | (2006.01) |
| *H01L 23/373* | (2006.01) |
| *H01L 23/00* | (2006.01) |
| *H01L 23/31* | (2006.01) |
| *H01L 21/56* | (2006.01) |

(52) U.S. Cl.
CPC ............ *H01L 25/165* (2013.01); *H01L 21/565* (2013.01); *H01L 23/3107* (2013.01); *H01L 23/3735* (2013.01); *H01L 23/49568* (2013.01); *H01L 23/49575* (2013.01); *H01L 24/85* (2013.01); *H01L 25/50* (2013.01); *H01L 2924/1203* (2013.01); *H01L 2924/13055* (2013.01); *H01L 2924/13091* (2013.01); *H01L 2924/14* (2013.01)

(58) Field of Classification Search
CPC ............ H01L 23/49568; H01L 25/165; H01L 23/3735
See application file for complete search history.

(56) References Cited

FOREIGN PATENT DOCUMENTS

| CN | 102516500 | * | 6/2012 | ............. C08G 59/30 |
|---|---|---|---|---|
| KR | 2002-0095053 A | | 12/2002 | |
| KR | 10-2006-0017711 A | | 2/2006 | |

\* cited by examiner

*Primary Examiner* — Matthew Reames
*Assistant Examiner* — John Bodnar
(74) *Attorney, Agent, or Firm* — Ladas & Parry, LLP

(57) ABSTRACT

Disclosed herein are a power module package and a method of manufacturing the same. According to a preferred embodiment of the present invention, the power module package includes: a lead frame on which a power device and a control IC electrically connected to the power device and controlling the power device are mounted; and a thermal sheet bonded to one surface of the lead frame, wherein the thermal sheet includes first and second resin layers which include a thermal conductive inorganic filler and are added with a mixture of phenyl glycidyl ether (PGE) and alkyl glycidyl ether (Alkyl (C12 to C14) glycidyl ether), and a thermal spreader of a metal material disposed at a bonded interface which is formed between the first and second resin layers. Therefore, it is possible to easily improve a thermal property of the power module package by a thermal spreading effect due to the thermal spreader.

10 Claims, 7 Drawing Sheets

POWER MODULE PACKAGE AND METHOD OF MANUFACTURING THE SAME

CROSS REFERENCE TO RELATED APPLICATION

This application claims the benefit of Korean Patent Application No. 10-2014-0010456, filed on Jan. 28, 2014, entitled "Power Module Package And Method Of Manufacturing The Same" which is hereby incorporated by reference in its entirety into this application.

BACKGROUND OF THE INVENTION

1. Technical Field

The present invention relates to a power module package and a method of manufacturing the same.

2. Description of the Related Art

Generally, a power module is an electronic component which is mounted on a lead frame and has adopted a structure in which a power device and a control IC are bonded to each other and then molded. Therefore, since heat radiation of the power device is mainly performed by the lead frame and an epoxy molding compound (EMC) having low thermal conductivity, thermal property required in the power module may not be satisfied.

Meanwhile, according to a power module package published in Patent Document 1, Patent Document 1 discloses that thermal capability may be improved by bonding a ceramic substrate to the lead frame. However, the structure has a problem in that all the devices are mounted on the lead frame and thus thermal property is limited and the thermal property totally relies on thermal property of the ceramic substrate. That is, the ceramic substrate has a limitation of a usable thickness due to material properties.

On the other hand, according to a power module package published in Patent Document 2, Patent Document 2 discloses that devices are bonded to a direct bonding copper (DBC) substrate having excellent thermal property to be able to implement high heat radiation. However, the DBC substrate is generally more expensive than a thermal substrate and is thus expensive in proportion to improvement in the thermal property.

PRIOR ART DOCUMENT

Patent Document (Patent Document 1) KR2002-0095053A
(Patent Document 2) KR2006-0017711A

SUMMARY OF THE INVENTION

The present invention has been made in an effort to improve thermal property so as to increase efficiency and reliability of a power module.

Further, the present invention has been made in an effort to provide a power module package capable of easily improving thermal property.

In addition, the present invention has been made in an effort to provide a method of manufacturing a power module package in which an in-line process may be performed.

According to a preferred embodiment of the present invention, there is provided a power module package, including: a lead frame on which a power device and a control IC electrically connected to the power device and controlling the power device are mounted; and a thermal sheet bonded to one surface of the lead frame, wherein the thermal sheet includes first and second resin layers which include a thermal conductive inorganic filler and are added with a mixture of phenyl glycidyl ether (PGE) and alkyl glycidyl ether (Alkyl (C12 to C14) glycidyl ether), and a thermal spreader disposed at a bonded interface which is formed between the first and second resin layers.

The inorganic filler may be selected from a group consisting of aluminum oxide ($Al_2O_3$), aluminum nitride (MN), silicon nitride (SiN), silicon dioxide ($SiO_2$), silicon carbide (SiC), or a combination thereof.

The mixture may include a mixture of phenyl glycidyl ether and alkyl glycidyl ether which are mixed at a mixing ratio of 2:1.

The thermal spreader may include a metal wire, a metal pipe, or a metal mesh.

The power module package may further include: a metal layer disposed on one surface of the thermal sheet.

The power module package may further include: a molding part formed by molding the power device, the control IC, the lead frame, and the thermal sheet so as to expose one surface of the metal layer and a tip of the lead frame to the outside.

According to another preferred embodiment of the present invention, there is provided a method of manufacturing a power module package, including: (a) preparing a first resin layer which includes a thermal conductive inorganic filler and is added with a mixture of phenyl glycidyl ether (PGE) and alkyl glycidyl ether (Alkyl (C12 to C14) glycidyl ether); (b) disposing a thermal spreader made of a metal material on one surface of the first resin layer; (c) disposing a second resin layer, which includes the thermal conductive inorganic filler and is added with the mixture of phenyl glycidyl ether (PGE) and alkyl glycidyl ether (Alkyl (C12 to C14) glycidyl ether), on one surface of the thermal spreader; (d) performing lamination on the first and second resin layers to compress and bond the first and second resin layers; (e) mounting a power device and a control IC on a lead frame having one surface to which a thermal sheet formed by bonding the first and second resin layers is bonded and wire bonding between the lead frame and the power device and the control IC; (f) disposing the thermal sheet on one surface of the lead frame and disposing a metal foil on one surface of the thermal sheet; and (g) performing molding with an epoxy molding compound so as to expose one surface of the metal foil and a tip of the lead frame to the outside.

The inorganic filler may be selected from a group consisting of aluminum oxide ($Al_2O_3$), aluminum nitride (MN), silicon nitride (SiN), silicon dioxide ($SiO_2$), silicon carbide (SiC), or a combination thereof.

The mixture may include a mixture of phenyl glycidyl ether and alkyl glycidyl ether which are mixed at a mixing ratio of 2:1.

The thermal spreader may include a metal wire, a metal pipe, or a metal mesh.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
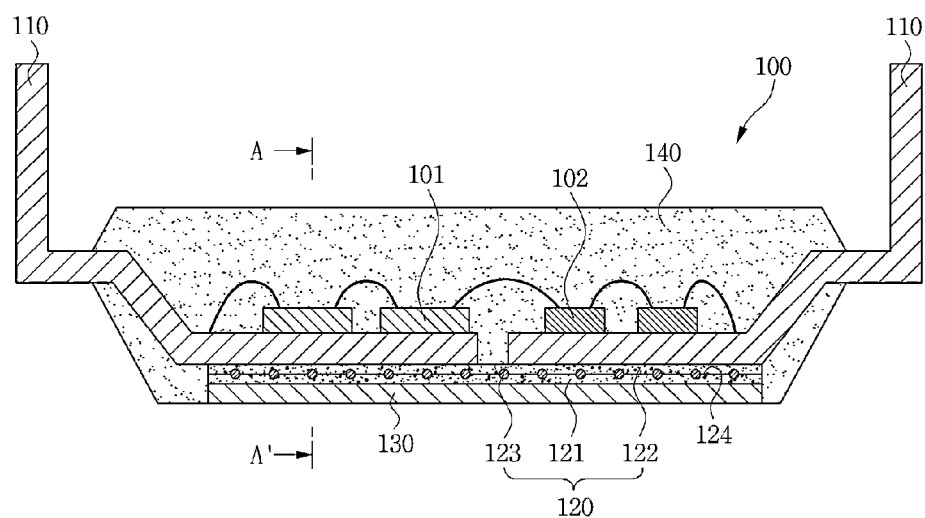
FIG. 1 is a cross-sectional view of a power module package according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the accompanying drawings.

A power module package according to a preferred embodiment of the present invention includes a lead frame on which a power device and a control IC are mounted and a thermal sheet bonded to one surface of the lead frame, in which the thermal sheet includes first and second resin layers which include a thermal conductive inorganic filler, are mixed with a mixture, and have a thermal spreader disposed at a bonded interface.

That is, market demands for a high-integration/high-capacity/miniaturized power module have been increased, and thus a heat generation problem of electronic components may lead to degradation in the overall performance of the module. Therefore, in the power module package according to the preferred embodiment of the present invention, the thermal sheet includes the thermal spreader including of a metal wire, a metal pipe, or a metal mesh which is disposed at the bonded interface between the first and second resin layers which may be made of an organic material, etc., including prepreg, epoxy, polyimide, liquid crystal polymer, and the like to improve the thermal property, in which the thermal spreader is bonded to the first and second resin layers by an in-line process.

The power module package has more excellent thermal property than the lead frame or a structure in which the lead frame is bonded to a ceramic substrate. That is, the power module package may improve thermal property due to high thermal conductivity (3 to 30 W/Mk) of the thermal sheet. In detail, the thermal sheet includes an inorganic filler having an excellent thermal conductivity and the thermal property of the power module may be improved by a thermal spreading effect due to the thermal spreader.

Figure 12:
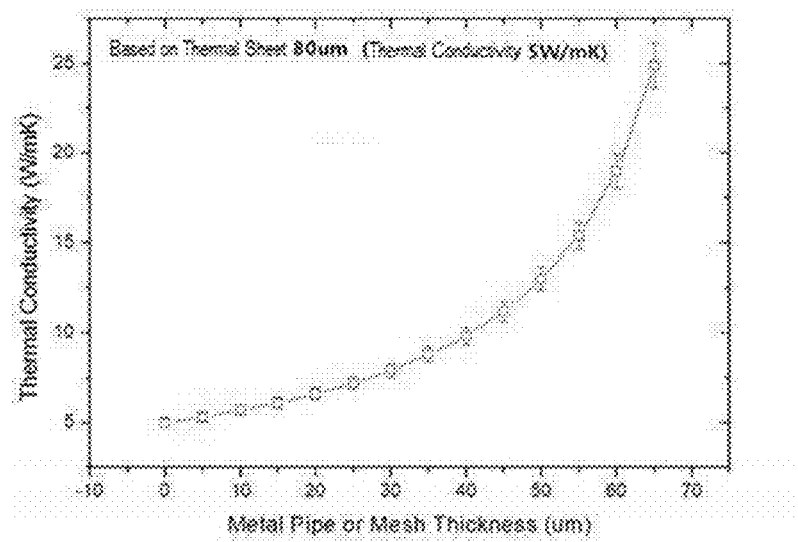
FIG. 12 shows a graph of the thermal conductivity of the thermal sheet according to the thickness of the metal pipe or the metal mesh.

Here, the thermal conductivity of the thermal sheet may be modulated at 30 W/mK or more in proportion to a thickness of the metal pipe or the metal mesh configuring the thermal spreader, which is shown in the following FIG. 12.

Further, the power module package includes a short thermal path through which heat from a power device is transferred to the thermal sheet, a metal layer added to the thermal sheet, and a heat sink bonded to the metal layer, thereby more improving the thermal property.

Meanwhile, a method of manufacturing a power module package according to a preferred embodiment of the present invention performs bonding between the first and second resin layers and bonding between the lead frame and the thermal sheet and the metal layer during a molding process, thereby saving the package cost and greatly contributing to the improvement in management of productivity. That is, the lead frame, the thermal sheet, and a metal foil are bonded to one another by the in-line during a process of molding an epoxy molding compound (EMC), thereby saving the costs and improving the management of productivity.

First Preferred Embodiment

Figure 2:
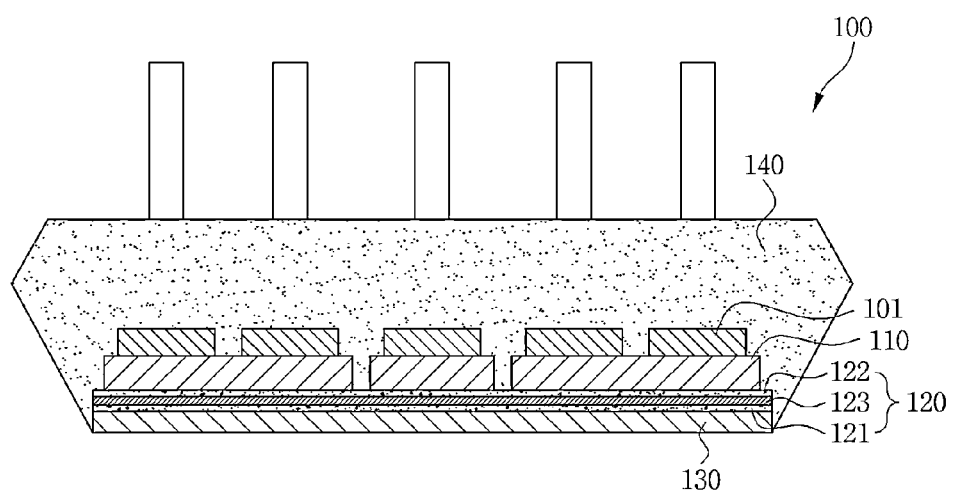
FIG. 2 is a cross-sectional view of the power module package taken along the line A-A'.
Figure 3:
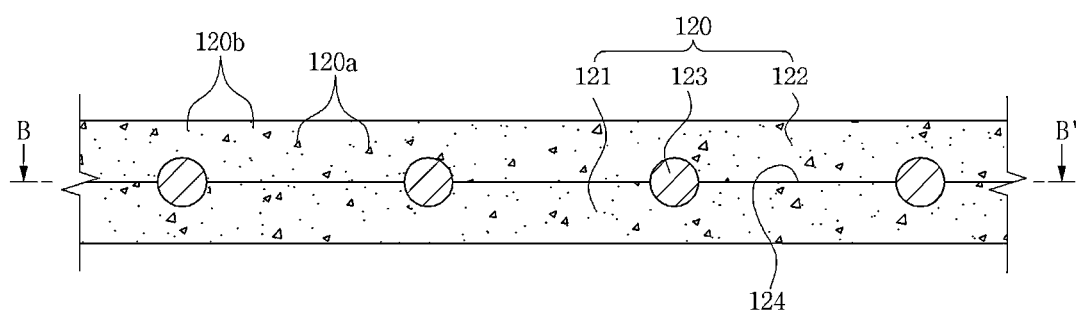
FIG. 3 is a partially enlarged cross-sectional view of a thermal sheet according to a preferred embodiment of the present invention.

As illustrated in FIGS. 1 to 3, a power module package 100 according to a preferred embodiment of the present invention may include a lead frame 110 on which a power device 101 and a control IC 102 controlling the power device 101 are mounted, a thermal sheet 120 which is bonded to one surface of the lead frame 110, a metal layer 130 which is bonded to the thermal sheet 120, and a molding part 140 which molds these devices.

The thermal sheet 120 is made of an organic material including prepreg, epoxy, polyimide, and liquid crystal polymer and includes first and second resin layers 121 and 122 including a thermal conductive inorganic filler 120a and added with a mixture 120b improving a bonding strength to have high thermal conductivity and adhesion and a thermal spreader 123 made of a metal material which is disposed at bonded interface 124 formed between the first and second resin layers 121 and 122.

Here, the inorganic filler 120a may be selected from a group consisting of, for example, aluminum oxide ($Al_2O_3$), aluminum nitride (MN), silicon nitride (SiN), silicon dioxide ($SiO_2$), silicon carbide (SiC), or a combination thereof, but is not limited thereto. Further, the inorganic filler 120a may easily improve the thermal conductivity as the content (85% or more) is increased.

Further, as the mixture 120b, a mixture prepared by mixing, for example, phenyl glycidyl ether (PGE) and alkyl (C12 to C14) glycidyl ether (Alkyl (C12 to C14) glycidyl ether) at a mixing ratio of 2:1 may be selected. That is, this may be defined by PGE:Alkyl (C12 to C14) glycidyl ether=2:1.

Figure 13:
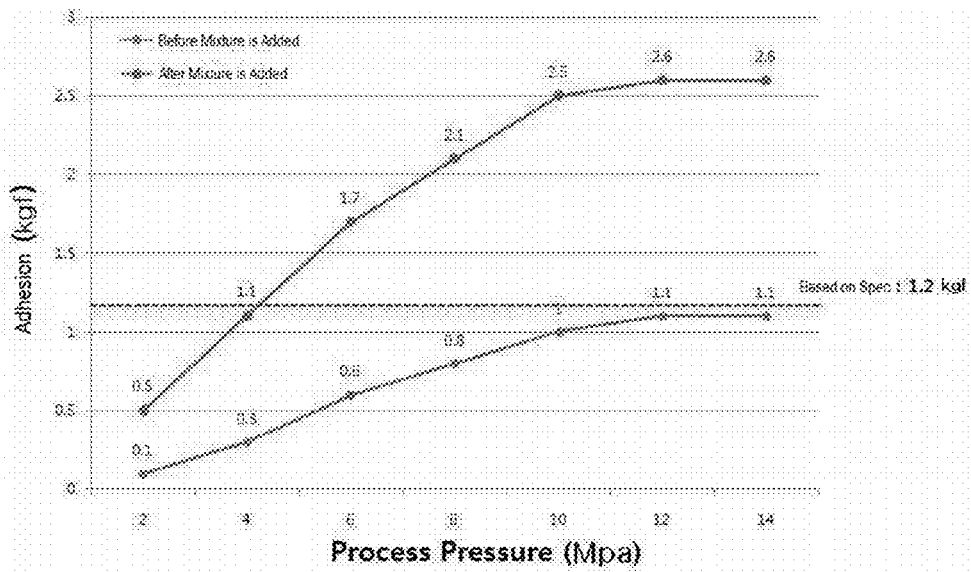
FIG. 13 shows a graph of the bonding strength between resin and metal according to the existence of the mixture.

Here, the mixture 120b is added to improve the bonding strength between resin and metal and the adhesion improving effect may be confirmed from experimental data of the following FIG. 13. Therefore, it is possible to easily prevent the bonding badness between the resin and the metal due to the addition of the mixture 120b at the time of manufacturing the power module package 100.

Meanwhile, the lead frame 110 may be machined to have a thickness and a form that are required in a design and according to the purpose, the lead frame in a form with or without a down-set may be selectively used. In the drawings, the lead frame 110 has the power device 101 mounted thereon, in which the power device includes an IGBT, a diode, a MOSFET, and the like, and the control IC 102 is mounted on one portion of the lead frame 110 and is electrically connected to the power device 101 by wire bonding.

Further, in the drawings, the metal layer 130 may be mounted on one surface of the thermal sheet 120 by bonding the metal foil to a lower portion of the second resin layer 122 and the lower portion of the metal layer 130 is bonded to a general heat sink to emit heat from the power device 101 to the outside.

The molding part 140 is formed by molding the power device 101, the control IC 102, the lead frame 110, and the thermal sheet 120 with the epoxy molding compound (EMC) so as to expose one surface, that is, a bottom surface of the metal layer 130 to the outside. In this case, a tip of the lead frame 110 is also exposed to the outside of the molding part 140 and thus is used as an external connecting terminal.

Figure 4:
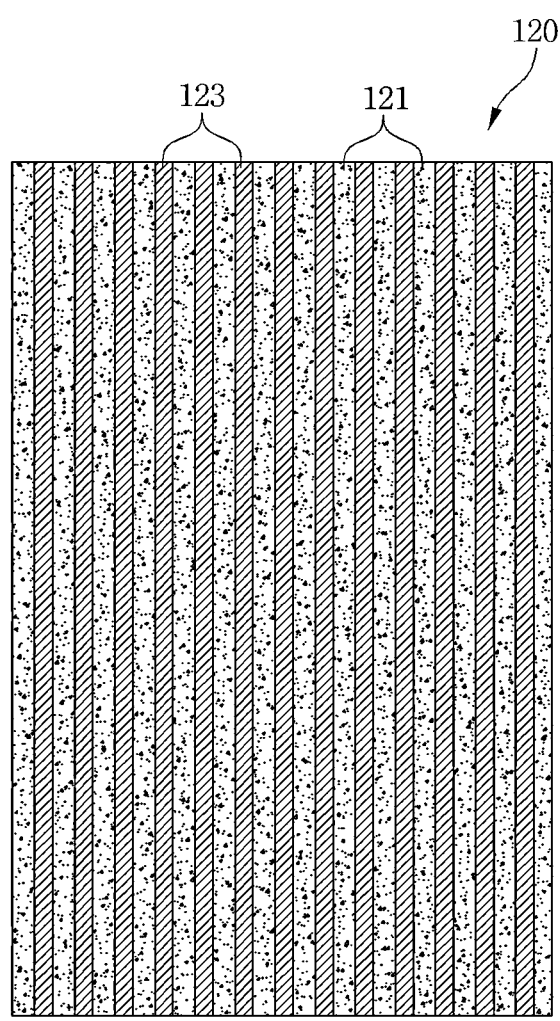
FIGS. 4 and 5 are plan views illustrating the line B-B' of FIG. 3.
Figure 5:
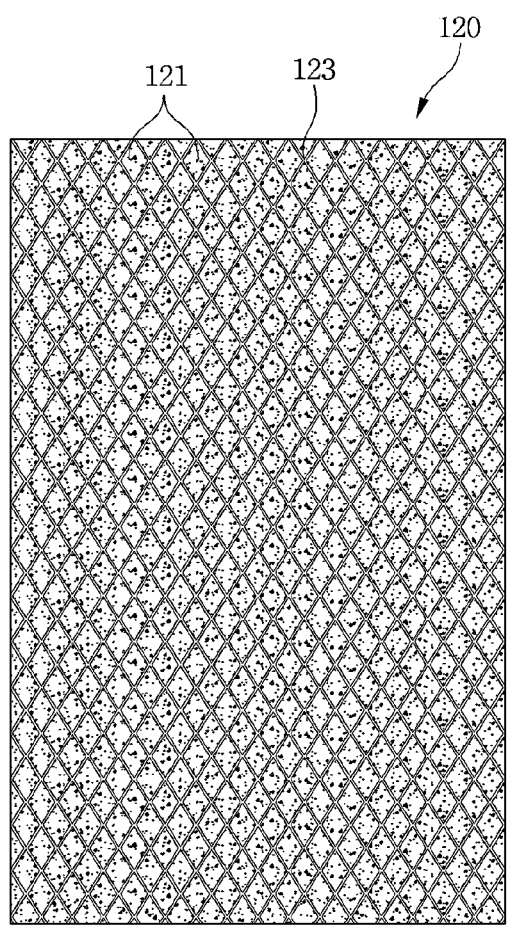
Figure 6:
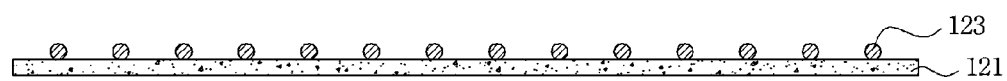
FIGS. 6 to 11 are cross-sectional views sequentially illustrating a process of manufacturing a power module package according to a preferred embodiment of the present invention.
Figure 7:
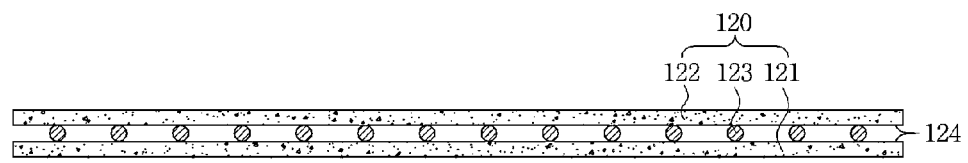
Figure 8:
Figure 9:
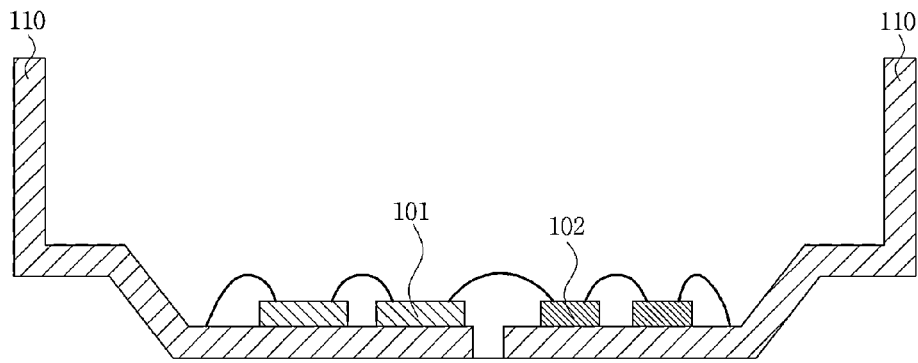
Figure 10:
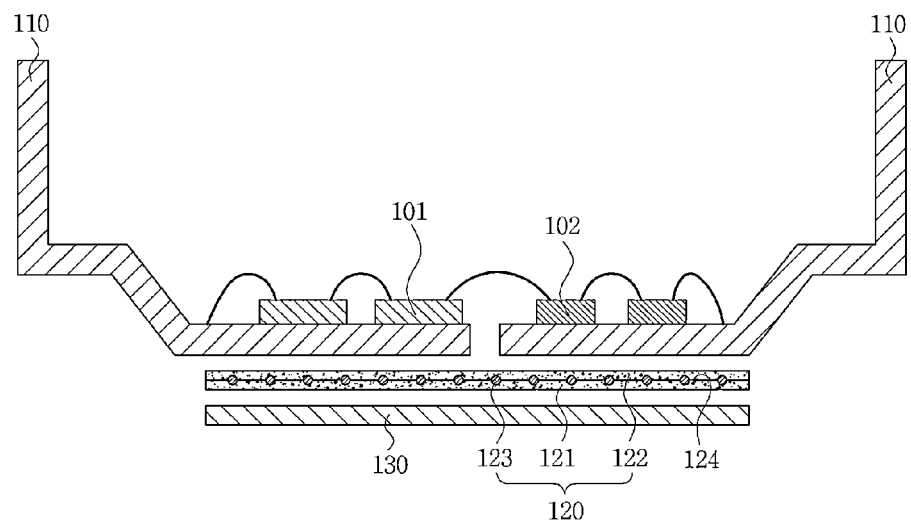
Figure 11:
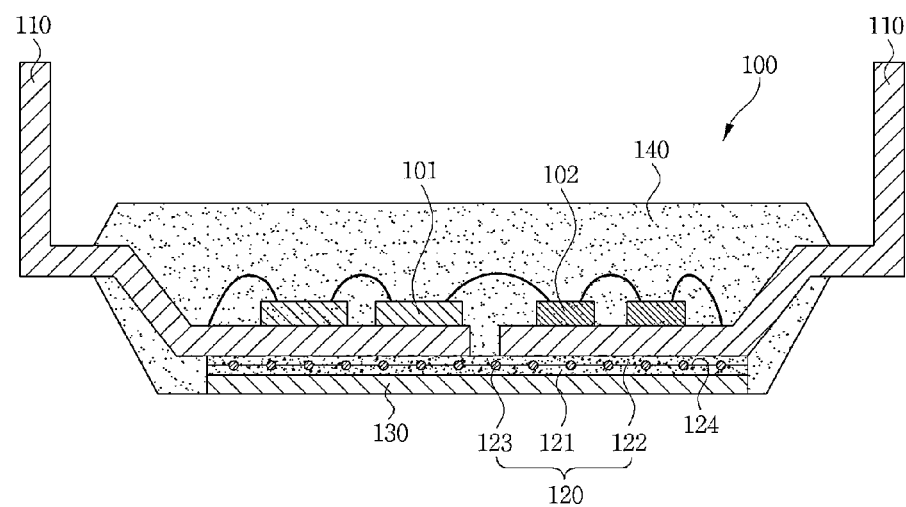

Therefore, the power module package 100 according to the preferred embodiment of the present invention includes a short thermal path through which the heat from the power device 101 is transferred to the thermal sheet 120, the metal layer 130 added to the thermal sheet 120, and the heat sink bonded to the metal layer 130, thereby more improving the thermal property As illustrated in FIGS. 3 to 5, the thermal spreader 123 is disposed at the bonding interface 124 which is formed between the first and second resin layers 121 and 122 to transfer the heat from the power device 101. The thermal spreader 123 may have a form in which the metal wire or the metal pipe which may be made of a metal material including copper (Cu), aluminum (Al), iron (Fe), titanium (Ti), silver (Ag), gold (Au), and the like having thermal conductivity higher than that of the inorganic filer 120a is disposed between the first and second resin layers 121 and 122 in a linear form or a form in which a metal mesh having a net shape is disposed at the bonded interface 124.

Here, the thermal spreader 123 may be designed to have an arbitrary form using the metal material in addition to the metal wire, the metal pipe, or the metal mesh. Further, the thickness of the metal wire, the metal pipe, or the metal mesh is controlled to be able modulate the thermal conductivity of the thermal sheet 120 at 30 W/mK or more.

Therefore, according to the power module package 100 according to the preferred embodiment of the present invention, it is possible to easily improve the thermal property due to the thermal spreading effect by the thermal spreader 123, such that the performance may be improved and the high reliability of heat radiation may be secured.

Second Preferred Embodiment

As illustrated in FIGS. 6 to 11, the method of manufacturing a power module package according to the embodiment of the present invention largely includes preparing the thermal sheet 120 and manufacturing the power module package 100 using the thermal sheet 120.

The thermal sheet 120 includes the first and second resin layers 121 and 122 which are made of the organic material, etc., including prepreg, epoxy, polyimide, liquid crystal polymer, and the like.

Here, the first and second resin layers 121 and 122 include the thermal conductive inorganic filler of 80% or more which may be selected from a group consisting of, for example, aluminum oxide ($Al_2O_3$), aluminum nitride (MN), silicon nitride (SiN), silicon dioxide ($SiO_2$), silicon carbide (SiC), or a combination thereof and are added with the mixture 120b of phenyl glycidyl ether (PGE) and alkyl (C12 to C14), glycidyl ether (Alkyl (C12 to C14) glycidyl ether) which are mixed at a mixing ratio of 2:1 to improve the bonding strength between the resin and the metal.

The thermal sheet 120 is manufactured by performing lamination on the first and second resin layers 121 and 122 to compress and bond the first and second resin layers in the state in which the thermal spreader 123 made of the metal material is disposed at the bonded interface 124 formed between the first and second resin layers 121 and 122.

That is, the metal wire, the metal pipe, or the metal mesh which may be made of the metal material including copper (Cu), aluminum (Al), iron (Fe), titanium (Ti), silver (Ag), gold (Au), and the like is disposed at the bonded interface 124 formed between the first and second resin layers 121 and 122 and then is subjected to the lamination, such that the thermal sheet 120 having high thermal conductivity due to the material property of the thermal spreader 123 may be manufactured.

Meanwhile, when the preparation of the thermal sheet 120 is completed, as the manufacturing of the power module package 100, the lead frame 110 machined in the desired thickness and form is prepared, the power device 101 including a IGBT, a diode, a MOSFET, and the like and the control IC 102 controlling the power device 101 are mounted on one surface of the lead frame 110 and the power device 101 and the control IC 102 are electrically connected to the lead frame 110 by the wire bonding, and the power device 101 and the control IC 102 are also connected to each other by the wire bonding.

As described above, when the device bonding and the wire bonding to the lead frame 110 are completed, after the previously prepared thermal sheet 120 is disposed at the lower portion of the lead frame 110 and in addition to this, the metal foil is disposed at the lower portion of the thermal sheet 120, the molding sealing these devices using the epoxy molding compound (EMC) is performed to form the molding part 140.

Here, the molding is performed by a method of applying a pressure (~10 MPa) at high temperature (~250° C.) except for the tip of the lead frame 110 for forming the bottom surface of the metal layer 130 configured of the metal foil and the external connecting terminal, such that the bonding among the lead frame 110, the thermal sheet 120, and the metal layer 130 may be made and after the bonding, the bonded form may be kept.

Therefore, according to the method of manufacturing a power module package according to the preferred embodiment of the present invention, the in-line process which performs the bonding among the thermal sheet 120, the metal layer 130, and the lead frame 110 during the molding process may be possible, and therefore the method of manufacturing a power module package according to the preferred embodiment of the present invention may more save the package costs and more improve the management of productivity than the manufacturing process according to the prior art of bonding the lead frame to the ceramic substrate with a liquid adhesive or manufacturing the separate thermal substrate and then solder-bonding the lead frame with the thermal substrate.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
   a lead frame on which a power device and a control IC electrically connected to the power device and controlling the power device are mounted; and
   a thermal sheet bonded to one surface of the lead frame,
   wherein the thermal sheet includes first and second resin layers which include a thermal conductive inorganic filler and are added with a mixture of phenyl glycidyl ether (PGE) and alkyl glycidyl ether (Alkyl (C12 to C14) glycidyl ether), and
   a thermal spreader of a metal material disposed at a bonded interface which is formed between the first and second resin layers.

2. The power module package as set forth in claim 1, wherein the inorganic filler is selected from a group consisting of aluminum oxide ($Al_2O_3$), aluminum nitride (AlN), silicon nitride (SiN), silicon dioxide ($SiO_2$), silicon carbide (SiC), or a combination thereof.

3. The power module package as set forth in claim 1, wherein the mixture includes a mixture of phenyl glycidyl ether and alkyl glycidyl ether which are mixed at a mixing ratio of 2:1.

4. The power module package as set forth in claim 1, wherein the thermal spreader includes a metal wire, a metal pipe, or a metal mesh.

5. The power module package as set forth in claim 1, further comprising:
   a metal layer disposed on one surface of the thermal sheet.

6. The power module package as set forth in claim 5, further comprising:
   a molding part formed by molding the power device, the control IC, the lead frame, and the thermal sheet so as to expose one surface of the metal layer and a tip of the lead frame to the outside.

7. A method of manufacturing a power module package, comprising:
   (a) preparing a first resin layer which includes a thermal conductive inorganic filler and is added with a mixture of phenyl glycidyl ether (PGE) and alkyl glycidyl ether (Alkyl (C12 to C14) glycidyl ether);
   (b) disposing a thermal spreader made of a metal material on one surface of the first resin layer;
   (c) disposing a second resin layer, which includes the thermal conductive inorganic filler and is added with the mixture of phenyl glycidyl ether (PGE) and alkyl glycidyl ether (Alkyl (C12 to C14) glycidyl ether), on one surface of the thermal spreader;
   (d) performing lamination on the first and second resin layers to compress and bond the first and second resin layers;
   (e) mounting a power device and a control IC on a lead frame having one surface to which a thermal sheet formed by bonding the first and second resin layers is bonded and wire bonding between the lead frame and the power device and the control IC;
   (f) disposing the thermal sheet on one surface of the lead frame and disposing a metal foil on one surface of the thermal sheet; and
   (g) performing molding with an epoxy molding compound so as to expose one surface of the metal foil and a tip of the lead frame to the outside.

8. The method as set forth in claim 7, wherein the inorganic filler is selected from a group consisting of aluminum oxide ($Al_2O_3$), aluminum nitride (AlN), silicon nitride (SiN), silicon dioxide ($SiO_2$), silicon carbide (SiC), or a combination thereof.

9. The method as set forth in claim 7, wherein the mixture includes a mixture of phenyl glycidyl ether and alkyl glycidyl ether which are mixed at a mixing ratio of 2:1.

10. The method as set forth in claim 7, wherein the thermal spreader includes a metal wire, a metal pipe, or a metal mesh.

* * * * *